(12) United States Patent
Ledermann et al.

(10) Patent No.: US 12,044,596 B2
(45) Date of Patent: Jul. 23, 2024

(54) METHOD FOR DIAGNOSING EXHAUST GAS SENSORS

(71) Applicant: Robert Bosch GmbH, Stuttgart (DE)

(72) Inventors: Bernhard Ledermann, Weil der Stadt (DE); Claudius Bevot, Stuttgart (DE); Danka Dittmer-Gobeljic, Stuttgart (DE); Oemer Kaya, Sinsheim (DE); Stefan Kremer, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 408 days.

(21) Appl. No.: 17/440,109

(22) PCT Filed: Mar. 24, 2020

(86) PCT No.: PCT/EP2020/058052
§ 371 (c)(1),
(2) Date: Sep. 16, 2021

(87) PCT Pub. No.: WO2020/193496
PCT Pub. Date: Oct. 1, 2020

(65) Prior Publication Data
US 2022/0187167 A1 Jun. 16, 2022

(30) Foreign Application Priority Data
Mar. 27, 2019 (DE) .................. 102019204219.8

(51) Int. Cl.
*G01R 31/58* (2020.01)
*G01M 15/10* (2006.01)
(Continued)

(52) U.S. Cl.
CPC ...... *G01M 15/104* (2013.01); *G01N 27/4163* (2013.01); *G01R 31/58* (2020.01);
(Continued)

(58) Field of Classification Search
CPC ............ G01M 15/104; G01N 27/4065; G01N 27/4163; G01N 27/4175; G01R 31/58; H02H 3/00; H02H 3/023; H02H 3/20
See application file for complete search history.

(56) References Cited

U.S. PATENT DOCUMENTS 8,773,143 B2 * 7/2014 Ledermann ............ G01R 31/52
324/543
9,500,152 B2 * 11/2016 Ledermann ........... F02D 41/222
(Continued)

FOREIGN PATENT DOCUMENTS

DE  102010000663 A1  7/2011
DE  102011007068 A1  10/2012
(Continued)

OTHER PUBLICATIONS

International Search Report for PCT/EP2020/058052, Issued Jun. 8, 2020.

*Primary Examiner* — Vinh P Nguyen
(74) *Attorney, Agent, or Firm* — NORTON ROSE FULBRIGHT US LLP; Gerard A. Messina

(57) ABSTRACT

An evaluation and control unit for operating a wideband lambda sensor that has at least two electrical lines, the evaluation and control unit having at least two electrical terminals for electrical connection to the electrical lines of the wideband lambda sensor. Each of the electrical terminals has assigned to it a respective electrical switch via which each terminal is capable of being individually connected to at least one defined electrical potential. Each switch is voltage-resistant against the maximum short-circuit voltage that is to be expected at the respective terminal in case of fault. In addition, a method is described for the line-specific short-circuit diagnosis of the wideband lambda sensor (pin-pointing).

17 Claims, 8 Drawing Sheets

(51) Int. Cl.
*G01N 27/416* (2006.01)
*H02H 3/00* (2006.01)
*H02H 3/02* (2006.01)
*H02H 3/20* (2006.01)

(52) U.S. Cl.
CPC .............. *H02H 3/00* (2013.01); *H02H 3/023* (2013.01); *H02H 3/20* (2013.01)

(56) References Cited

U.S. PATENT DOCUMENTS

| | | | |
|---|---|---|---|
| 9,889,127 B2* | 2/2018 | Jain | A61P 35/00 |
| 10,330,767 B2* | 6/2019 | Das | G01R 35/005 |
| 10,591,453 B2* | 3/2020 | Hasse | G01N 27/41 |
| 10,983,187 B2* | 4/2021 | Gentz | G01R 33/09 |
| 11,709,198 B2* | 7/2023 | Kremer | G01M 99/00 |
| | | | 324/750.3 |
| 2013/0219984 A1 | 8/2013 | Paggel et al. | |

FOREIGN PATENT DOCUMENTS

| | | |
|---|---|---|
| DE | 102011077171 A1 | 11/2012 |
| EP | 2277035 A1 | 1/2011 |
| JP | H05107299 A | 4/1993 |
| JP | H05223776 A | 8/1993 |
| JP | 2018049726 A | 3/2018 |
| WO | 2015022278 A1 | 2/2015 |

* cited by examiner

METHOD FOR DIAGNOSING EXHAUST GAS SENSORS

BACKGROUND INFORMATION

German Patent Application No. DE 10 2010 000 663 A1 describes an evaluation and control unit that is realized as an ASIC. It is used for the operation of a wideband lambda sensor that has electrical lines, the evaluation and control unit having electrical terminals for electrical connection to the electrical lines of the wideband lambda sensor, and the electrical terminals each being assigned an electrical switch via which the respective terminal can be connected to ground.

SUMMARY

The present invention is based on the consideration on the part of the inventors that the conventional switches in the related art may be exposed to high electrical loads in case of a fault. For example, in the case of a short circuit of a line of the lambda sensor with a supply voltage, the switches may be exposed to the full supply voltage and the currents resulting therefrom. In this case, the maximum short-circuit voltage that can be expected at the respective terminal in the case of a fault can be given by the supply voltage.

For example, the maximum short-circuit voltage that can be expected at the respective terminal in the case of a fault may be 16V, 36V, or even 48V or more.

In order to ensure, without further hardware or software protective mechanisms, that, in such cases of fault in the lines of the wideband lambda sensor, no damage to the evaluation and control unit results, and moreover also to enable in case of fault a method for diagnosing the electrical lines of a wideband lambda sensor, in accordance with an example embodiment of the present invention, it is in particular provided that each switch is voltage-resistant against the maximum short-circuit voltage to be expected at the respective terminal in case of fault.

The voltage resistance of a component against a voltage is understood as the property of the component by which it is capable of being exposed to this voltage without damage over longer time periods, for example several seconds. In particular with greater miniaturization, for example given the realization of the component as part of an evaluation and control unit realized as an ASIC, this requires corresponding constructive measures, for example adequate insulation and/or shielding.

In order to enable the desired diagnoses to be carried out in case of fault, it is preferred that the respective switch be realized as a low-ohmic switch, i.e., having in the closed state in particular a volume resistance that is not greater than the internal resistance of the electrochemical cells of the wideband lambda sensor at operating temperature, and/or in particular having a volume resistance that is not greater than 100 ohms.

The at least one defined electrical potential provided according to the present invention can be a ground potential, for example 0V, or can be a virtual ground at some other potential. It can also be provided that, through corresponding voltage sources and/or corresponding voltage dividers, various potentials can be provided, so that the defined electrical potential can assume two or more different defined values.

In particular, in accordance with an example embodiment of the present invention, a voltage divider is provided between the respective switch and the defined electrical potential, by which, in case of fault, a partial voltage of the maximum short-circuit voltage to be expected can be picked off that is within the measurement range of a measurement system, for example an ADC, of the evaluation and control unit. In this way, a targeted diagnosis of the wideband lambda sensor can be carried out in case of fault.

The measurement range of the measurement system, for example of the ADC, of the evaluation and control unit can be for example 0V-3.6V, or for example -5V-+5V.

The voltage divider can thus for example subdivide the maximum short-circuit voltage to be expected down to the upper bound of the measurement range of the measurement system. Given a maximum short-circuit voltage to be expected of 36V and an upper bound of the measurement range of the measurement system of 3.6V, a voltage divider can thus for example be provided that divides the voltage in the ratio 9 to 1.

Advantageously, a single voltage divider can be provided that is connected to all the switches. Alternatively, an individual voltage divider can be assigned to each switch.

It is advantageous if the terminals are capable of being connected to one another, in particular short-circuited, via the switches. The lines of the wideband lambda sensor can then be set to a common electrical potential, whereby the wideband lambda sensor is protected, in particular if the switches are then opened only for diagnostic purposes and otherwise remain closed.

If, in addition, a further switch is situated between the switches and the defined electrical potential, this switch can be opened in case of fault, so that a flow of current through the wideband lambda sensor to the defined electrical potential then does not take place.

In accordance with an example embodiment of the present invention, it can be provided that, for the realization of the voltage divider, two ohmic resistances are connected in series between the respective switch and the defined electrical potential. The ratio of the resistance values of the ohmic resistances then determines the ratio in which the voltage at the voltage divider is divided. Given a maximum short-circuit voltage to be expected of 36V against the defined electrical potential, and an upper bound of the measurement range of the measurement system of 3.6V against the defined potential, ohmic resistances of 3.24 kOhm and 360 Ohm can then for example be selected, if a maximum of 10 mA is intended to flow.

In a highly preferred development of the present invention, is provided that the ohmic resistance of the voltage divider oriented toward the switch is also voltage-resistant against the maximum short-circuit voltage to be expected at the terminals in case of fault.

Here it can be provided that the voltage resistance of the ohmic resistance of the voltage divider oriented away from the switch is not greater than the voltage resistance of the measurement system.

The present invention also includes a method for diagnosing the electrical lines of a wideband lambda sensor, through which, when there is a short circuit at one of the electrical lines of the wideband lambda sensor, it can be unambiguously determined at which of the lines the short circuit is taking place (pinpointing). In this method, in particular an evaluation and control unit as described above is used, and it is provided that exactly one of the electrical switches is closed one after the other and a current assigned to the respective electrical terminal, or a variable representing this current, is ascertained.

In a first alternative, the presence of a short circuit can be assumed as by the method according to the present invention. This is the case for example if it was determined ahead of time that one, a plurality of, or all terminals of the evaluation and control unit are at potentials outside the expected operating range. In this case, it is provided that the short circuit is assigned to the line that is connected to the terminal at which the current having the highest magnitude was ascertained.

In a second alternative, it is first determined via the method itself that a short circuit is present. In addition to the above-described possibility, this can take place by verifying that the magnitude of the largest current is greater than or equal to a fixedly specified threshold value, or a threshold value that is determined as a function of a temperature of the wideband lambda sensor. The short circuit is then assigned to the line that is connected to the terminal at which the current having highest magnitude was ascertained.

In accordance with an example embodiment of the present invention, in order to ensure the unambiguity of the method, it can be provided that a short circuit is assigned to a line only under the further condition that the current having the largest magnitude differs from the current having the second-largest magnitude by a specified minimum amount. The minimum amount can be a minimum difference or a minimum factor. The minimum difference can for example be given by the measurement precision of the measurement system with the addition of all further occurrent tolerances, and can be for example 100 µA.

In a development of the present invention, it can be provided that if it is known that a short circuit exists at one of the electrical lines, or if it is inferred that there is a short circuit, and in addition it is not possible to assign the short circuit to a line because the current having the largest magnitude does not differ from the current having the second-largest magnitude by a specified minimum measure, then the method is repeated after a waiting time that allows the wideband lambda sensor to cool. When the wideband lambda sensor cools, its internal resistance increases and it can be expected that the current will decrease through the lines at which there is no short circuit. It can then be unambiguously determined at which line the short circuit is present.

A development of the method is preferably done using an evaluation and control unit in which the defined electrical potential can assume two different defined values. Here it is provided that a first current is measured for each connecting line while the defined potential has a first value, and a second current is measured while the defined potential has a second value.

The different defined values of the defined electrical potential can be generated for example via adjustable voltage dividers.

Under the assumption that the electrical connections of the lambda sensor to one another are high-ohmic, the calculation is done according to the equation:

$$R_{SC} = [R_{ref}*(I_1 - I_2 - I_{0,1} + I_{0,2}) + V_{SET,1} - V_{SET,2}]/(I_2 - I_1 - I_{0,2} + I_{0,1}).$$

Here:

$R_{SC}$: the short-circuit resistance $R_{ref}$: the total resistance between the defined potential and the switch $I_1$, $I_2$: the current assigned to the terminal given the presence of the first or second potential, with closed switch $I_{O1}$, $I_{O2}$: the current assigned to the terminal given the presence of the first or second potential, with open switch $V_{SET1}$, $V_{SET2}$: the first or, respectively, second potential.

Under the assumption that the electrical lines of the lambda sensor are high-ohmic to one another, the calculation takes place according to the equation:

$$V_{SC} = 1/2*[R_{SC}*(I_1 + I_2 + I_{0,1} + I_{0,2}) + R_{ref}*(I_1 + I_2) + V_{SET,1} + V_{SET,2}].$$

Here:

$V_{SC}$: the short-circuit voltage.

In principle, for each terminal line a short-circuit resistance and a short-circuit voltage can be determined by calculation. However, if the electrical lines of the lambda sensor are not high-ohmic to one another, the internal resistances of the lambda sensor are known anyway, or particular values are assumed, then the calculation of the short-circuit resistances and the calculation of the short-circuit voltages is done by solving the resulting linear equation systems.

Advantageously, a short circuit is inferred if at least one ascertained short-circuit resistance is below a specified threshold value, and the short circuit is assigned to the line that is connected to the terminal at which the smallest short-circuit resistance has occurred.

It can be provided that in the case in which the smallest short-circuit resistance differs from the second-smallest short-circuit resistance by not more than an additive or multiplicative threshold value, the measurements are repeated after a waiting period in which the wideband lambda sensor cools off. Due to the cooling, it can be expected that the short-circuit resistance will increase at the lines at which there is no short circuit. It can then be unambiguously determined at which line the short circuit is actually present.

From the knowledge of the diagnostic result, suitable technical measures can be provided. For example, it can be provided that the information about the presence of a short circuit, in particular the fact of a short circuit; the line at which the short circuit was determined; the short-circuit potential and/or the short-circuit resistance; can be stored in a nonvolatile data memory, for example through an entry in a fault memory of the evaluation control unit and/or in a fault memory of the control device connected to the evaluation and control unit.

DETAILED DESCRIPTION OF EXAMPLE EMBODIMENTS

Figure 1A:
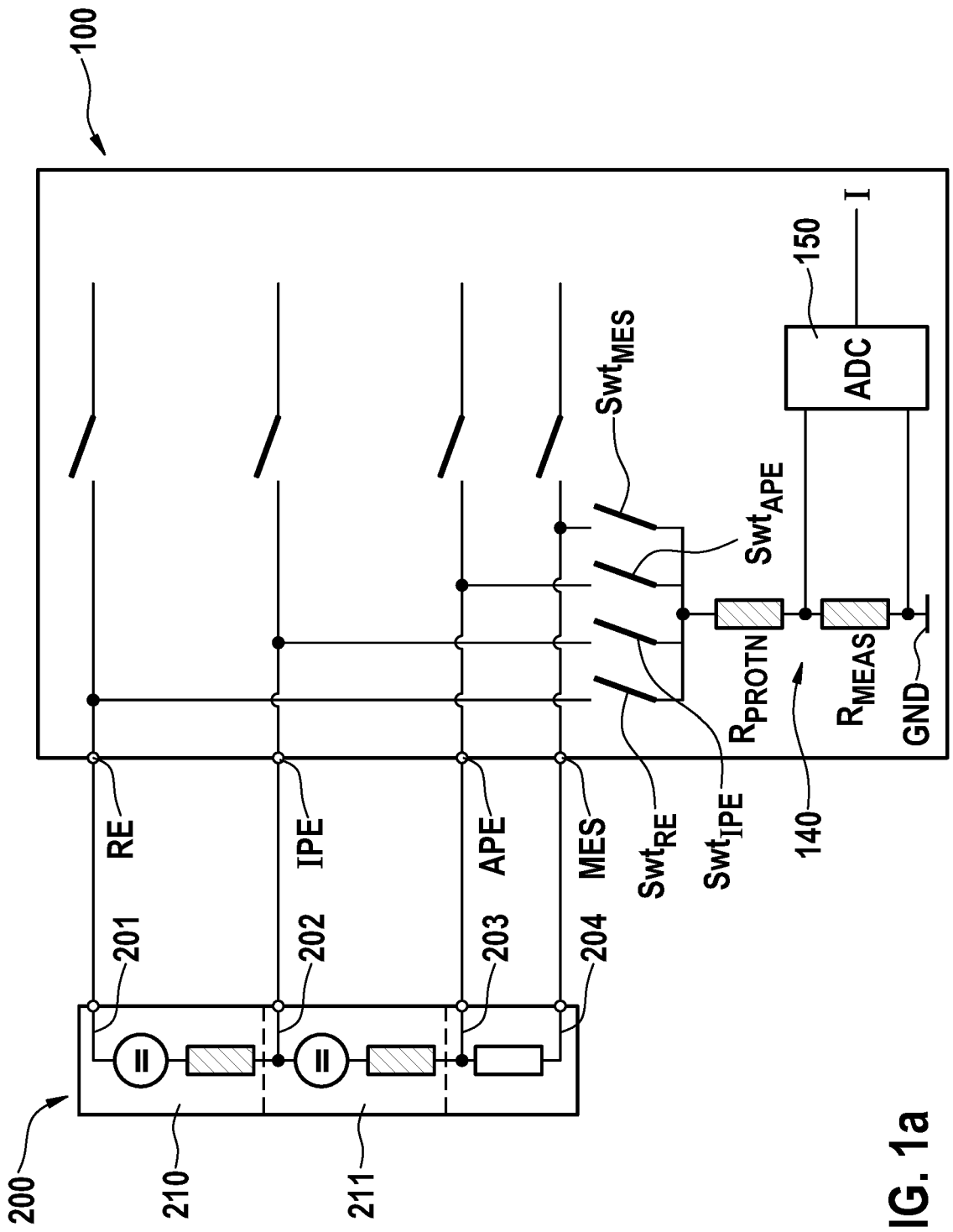
FIGS. 1a-1d show a first exemplary embodiment of an evaluation and control unit for operating a wideband lambda sensor, in accordance with the present invention.

FIG. 1a shows a first exemplary embodiment of an evaluation and control unit 100 for operating a wideband lambda sensor 200. Evaluation and control unit 100 is connected to electrical lines 201, 202, 203, 204 of a wideband lambda sensor 200 via four terminals RE, IPE, APE, MES. These lines lead to electrochemical cells 210, 211 of wideband lambda sensor 200. Possible details of wideband lambda sensor 200 are provided, for example, in German Patent Application No. DE 10 2011 007 068 A1.

Evaluation and control unit 100 is shown only to the extent necessary for the understanding of the present invention. Possible details of evaluation and control unit 100 are provided, for example, in European Patent No. EP 2 277 035 B1.

Evaluation and control unit 100 has, in the example, a terminal to ground GND to which each of the terminals RE, IPE, APE, MES is individually connected via a respective voltage-resistant switch $Swt_{RE}$, $Swt_{IPE}$, $Swt_{APE}$, $Swt_{MES}$, and via a common voltage divider 140.

In the example, common voltage divider 140 is made up of two ohmic resistances R_Protn and R_Meas, connected in series. In this example, their resistance values are R_Protn=3.24 kOhm and R_Meas=360 Ohm.

The voltage U across resistance R_Meas can be measured by an ADC 150 of evaluation and control unit 100. Division by R_Meas yields current I flowing through voltage divider 140.

For example, a further switch (not shown in FIG. 1a) can be provided between resistance R_Meas and GND. If this switch is opened in case of fault, this has the effect that a flow of current through wideband lambda sensor 200 to GND does not take place.

Figure 1B:
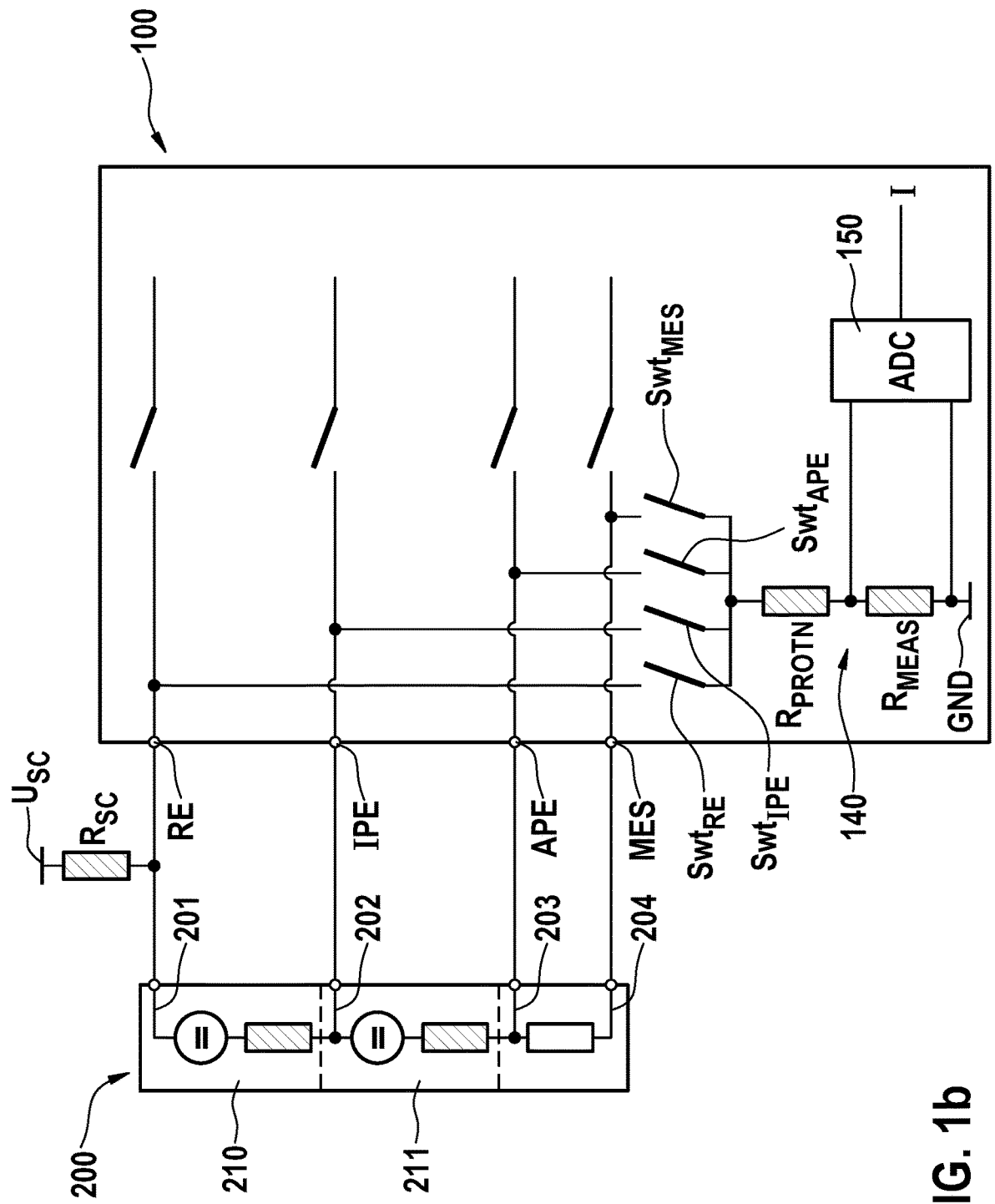

FIG. 1b shows the case of fault of a low-ohmic short circuit of line 201 to a supply voltage of 36V, showing, via line 201 of wideband lambda sensor 200 at terminal RE of evaluation and control unit 100, short-circuit voltage U_SC=36V over short-circuit resistance R_SC=0 Ohm.

Figure 1C:
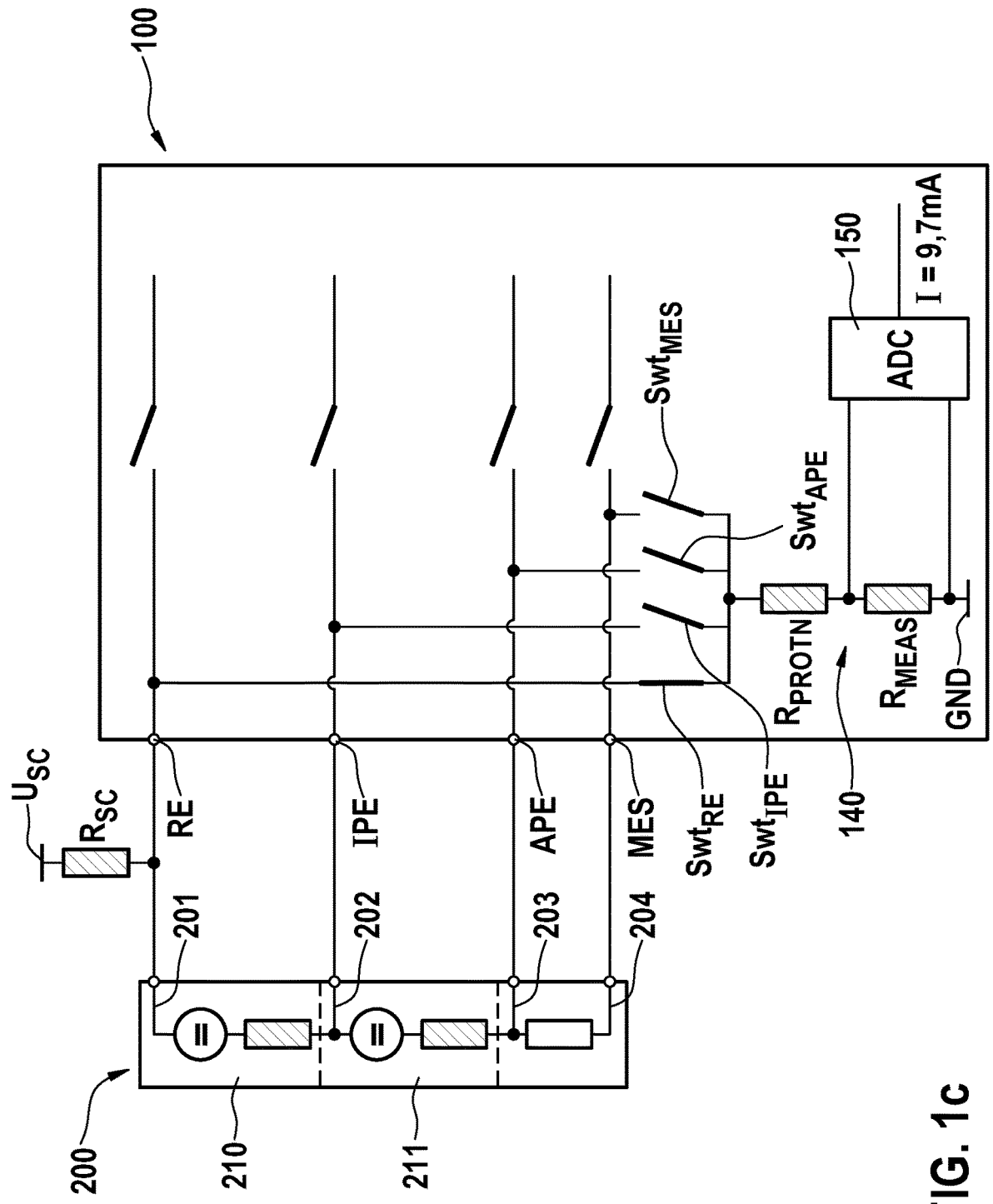

In FIG. 1c, the low-ohmic switch $Swt_{RE}$ assigned to terminal RE (internal resistance $R_{SwtRE}$=100 Ohm) has been closed, so that a current I of 9.7 mA flows from line 201 to GND via terminal RE and voltage divider 140. Consequently, there is a voltage of 3.502 V across measurement resistance R_Meas, which voltage is digitized by ADC 150.

Figure 1D:
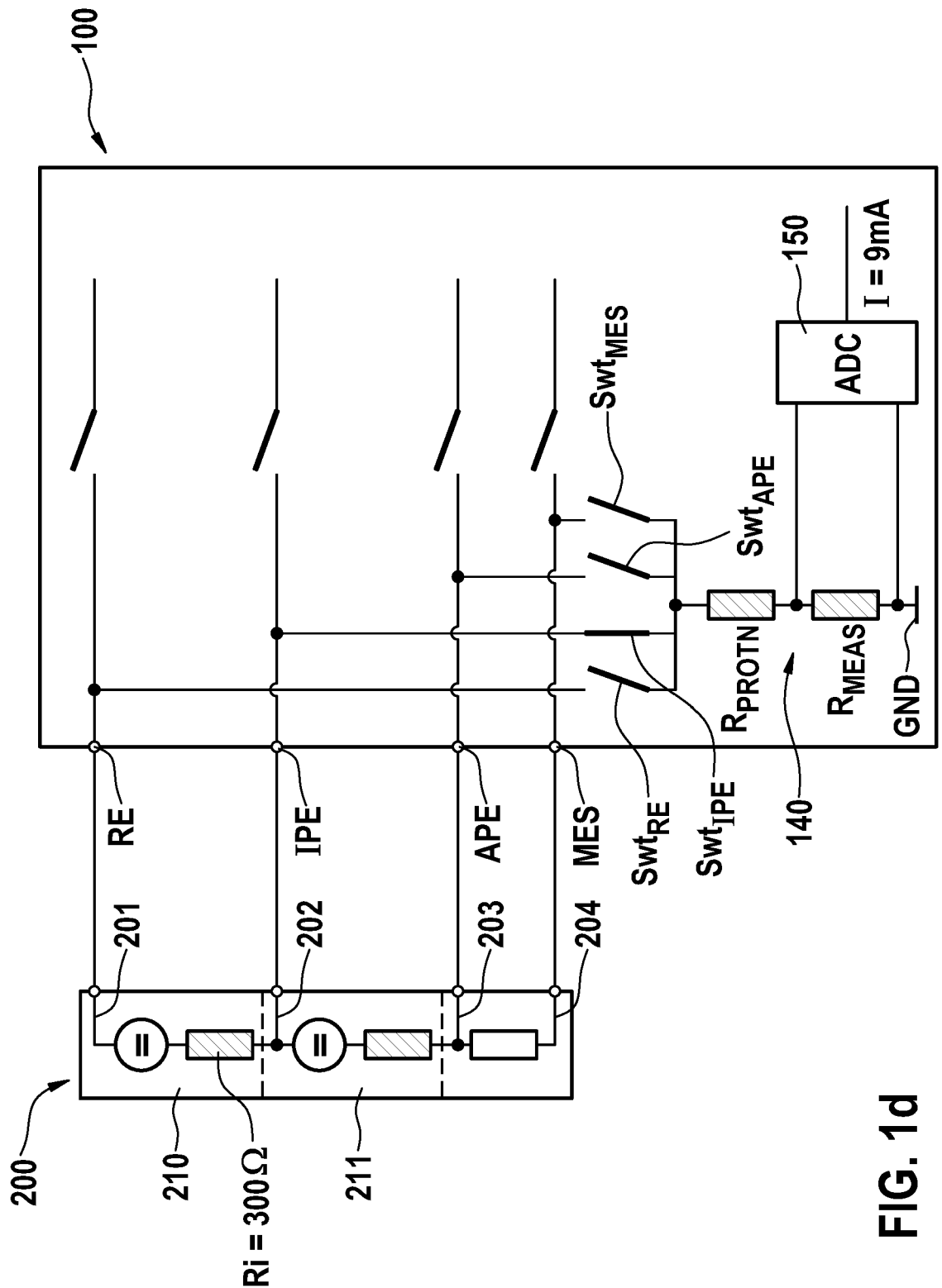

In FIG. 1d, the low-ohmic switch $Swt_{RE}$ assigned to terminal RE has been opened, and instead the low-ohmic switch $Swt_{IPE}$ (internal resistance $R_{SwtIPE}$=100 Ohm) assigned to terminal IPE has been closed. Because the internal resistance of the wideband lambda sensor between lines 201 and 202 is Ri=300 Ohm in the hot state, a current I of 9 mA now flows to ground GND via voltage divider 140. Correspondingly, across measurement resistor R_Meas there is a voltage of 3.240 V, which is digitized by ADC 150.

Similar currents and voltages result if, instead of switch $Swt_{IPE}$, the switch $Swt_{APE}$ is closed, or if the switch $Swt_{MES}$ is closed.

For terminal RE, the highest current I was unambiguously ascertained. Because it was known ahead of time that, at 36V, there was an impermissibly high potential at this terminal, i.e. it was known that in principle a short circuit was present, it is inferred that the short circuit is at line 201, connected to terminal RE, of wideband lambda sensor 200.

Figure 2:
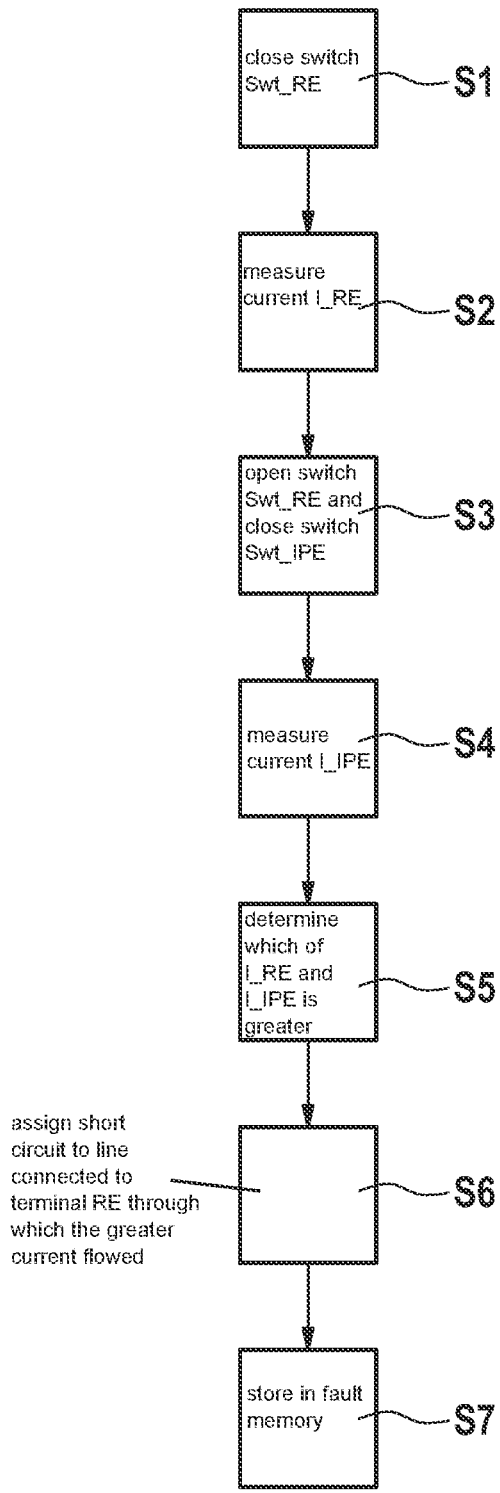
FIG. 2 shows a flow diagram of a diagnostic method with the evaluation and control unit according to FIG. 1, in accordance with the present invention.

The exemplary method according to the device shown with reference to FIG. 1 is shown in FIG. 2 as a flow diagram:

method step S1: closing switch $Swt_{RE}$
method step S2: measuring current $I_{RE}$ that subsequently flows to ground GND through voltage divider 140
method step S3: opening switch $Swt_{RE}$ and closing switch $Swt_{IPE}$
method step S4: measuring current $I_{IPE}$ that subsequently flows to ground GND through voltage divider 140
method step S5: determining which of the currents $I_{RE}$, $I_{PE}$ is greater
method step S6: assigning the short circuit to the line 201 that is connected to the terminal RE through which the greater current flowed
method step S7: storing the obtained information that a short circuit is present at line 201 in a fault memory of a control device connected to evaluation and control unit 100.

Figure 3A:
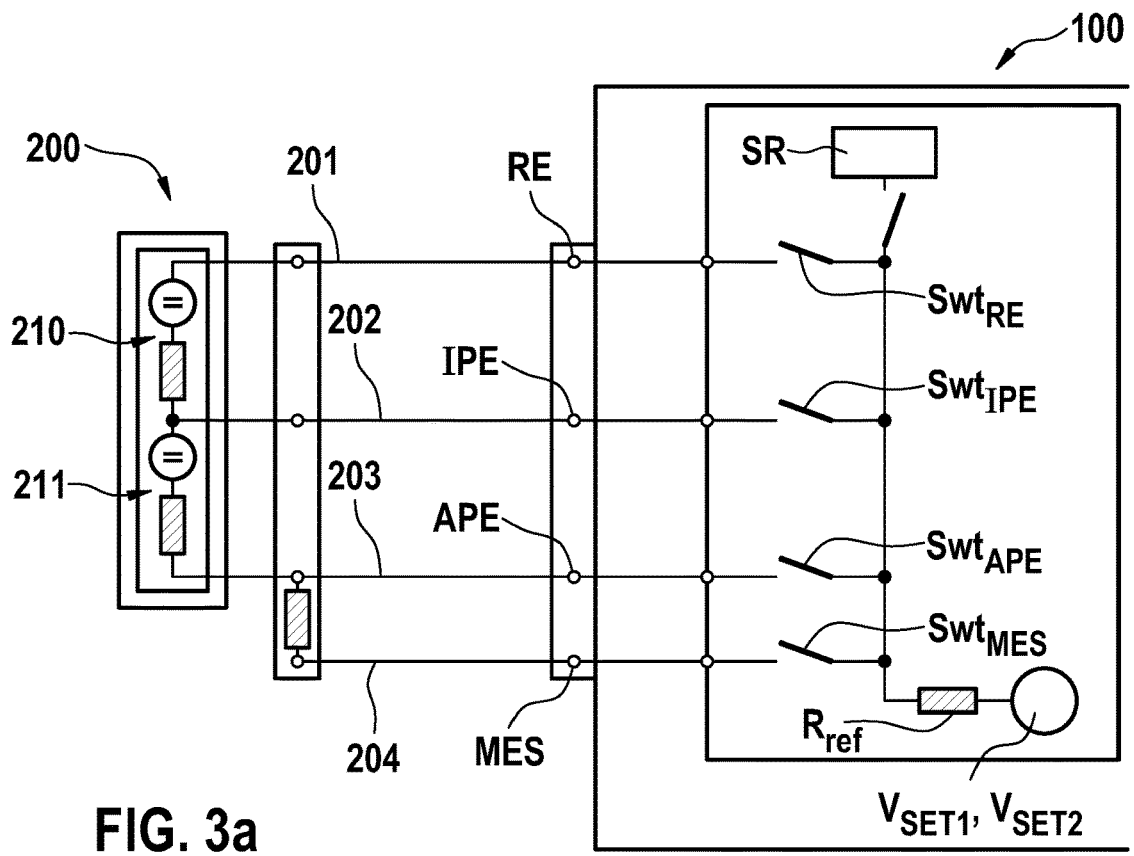
FIGS. 3a-3c show a second exemplary embodiment of an evaluation and control unit for operating a wideband lambda sensor, in accordance with the present invention.

FIG. 3a shows a second exemplary embodiment of an evaluation and control unit 100 for operating a wideband lambda sensor 200. Evaluation and control unit 100 is connected, via four terminals RE, IPE, APE, MES, to electrical lines 201, 202, 203, 204 of a wideband lambda sensor 200 that is cold enough that there is a very high internal resistance $R_i$, for example 1 MOhm, between each two of the lines 201, 202, 203, 204. These lines lead to electric chemical cells 210, 211 of wideband lambda sensor 200. Possible details of wideband lambda sensor 200 are provided, for example, in German Patent Application No. DE 10 2011 007 068 A1.

Evaluation and control unit 100 is shown only to the extent necessary for the understanding of the present invention. Possible details of evaluation and control unit 100 are provided, for example, in European Patent No. EP 2 277 035 B1.

In the example, evaluation and control unit 100 has a terminal at a defined potential that can assume the values $V_{SET1}$=2V and $V_{SET2}$=10V. Each of the terminals RE, IPE, APE, MES can be connected individually to this defined potential, via a respective voltage-resistant switch $Swt_{RE}$, $Swt_{IPE}$, $Swt_{APE}$, $Swt_{MES}$, and via a common reference resistance $R_{Ref}$=100 Ohm. In addition, a current source SR can be connected at the side of switches $Swt_{RE}$, $Swt_{IPE}$, $Swt_{APE}$, $Swt_{MES}$ oriented away from terminals RE, IPE, APE, MES. However, in the example this current source is separated by an open switch.

Figure 3B:
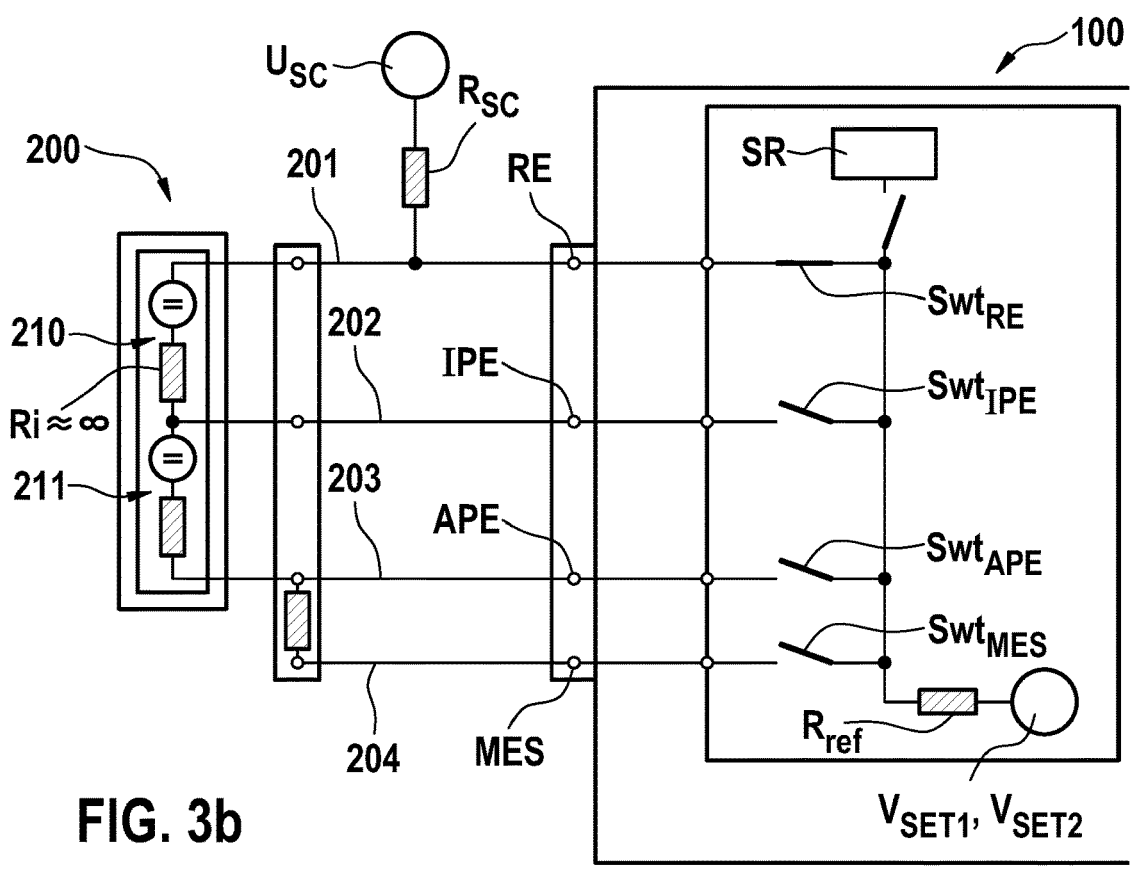

FIG. 3b shows the fault case of a low-ohmic short circuit of line 201 to a supply voltage, showing, via line 201 of wideband lambda sensor 200 at terminal RE of evaluation and control unit 100, short-circuit voltage Usc over short-circuit resistance Rsc.

At the defined potential $V_{SET1}$=2V, before the closing of switch $Swt_{RE}$ a current $I_{0,1}$ through $R_{Ref}$ of 0 mA is determined, and after the closing of switch $Swt_{RE}$ a current $I_1$ through $R_{Ref}$ of 100 mA is determined.

At the defined potential $V_{SET2}$=10V, before the closing of switch $Swt_{RE}$ a current $I_{0,2}$ through $R_{Ref}$ of 0 mA is determined, and after the closing of switch $Swt_{RE}$ a current $I_2$ through $R_{Ref}$ of 20 mA is determined.

Applying the equations:

$$R_{SC}=[R_{ref}*(I_1-I_2-I_{0,1}+I_{0,2})+V_{SET,1}-V_{SET,2}]/(I_2-I_1-I_{0,2}+I_{0,1}),$$

$$Vsc=1/2*[R_{SC}*(I_1+I_2+I_{0,1}+I_{0,2})+R_{ref}*(I_1+I_2)+V_{SET,1}+V_{SET,2}]$$

yields the result: $R_{SC}$=0 Ohm, $V_{SC}$=12 V.

Figure 3C:
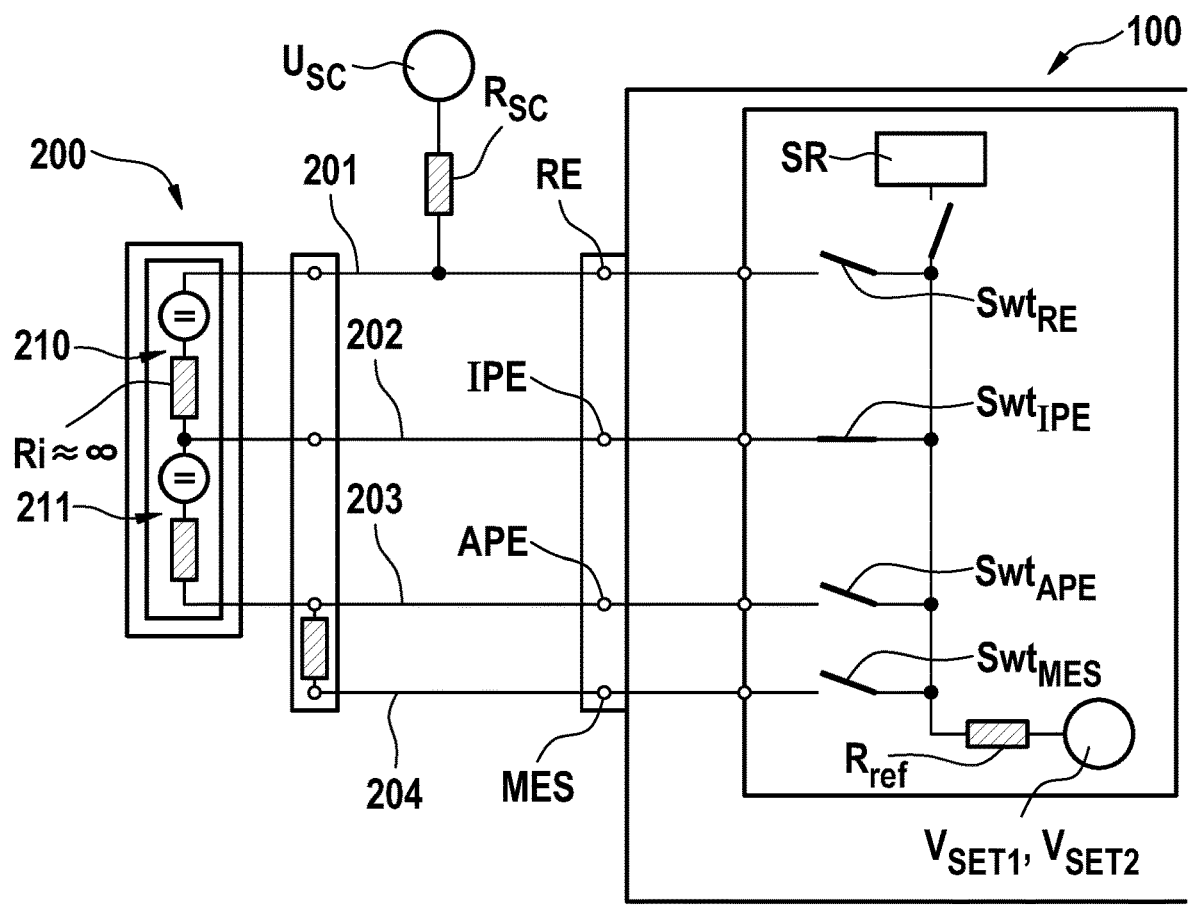

In FIG. 3c, low-ohmic switch $Swt_{RE}$ assigned to terminal RE is opened, and instead the low-ohmic switch $Swt_{IPE}$ assigned to terminal IPE is closed. A current of 0 mA flows through resistance $R_{Ref}$, independently of whether switch $Swt_{IPE}$ is opened or closed, and independent of the value of the defined potential $V_{SET1}$, $V_{SET2}$.

By applying the equations named above, the information is obtained that, with regard to line 202, a "short-circuit resistance" Rsc is very small.

Overall, it can be inferred that in this example there is a very low-ohmic short circuit of line 201 against a short-circuit voltage of 12V.

Figure 4:
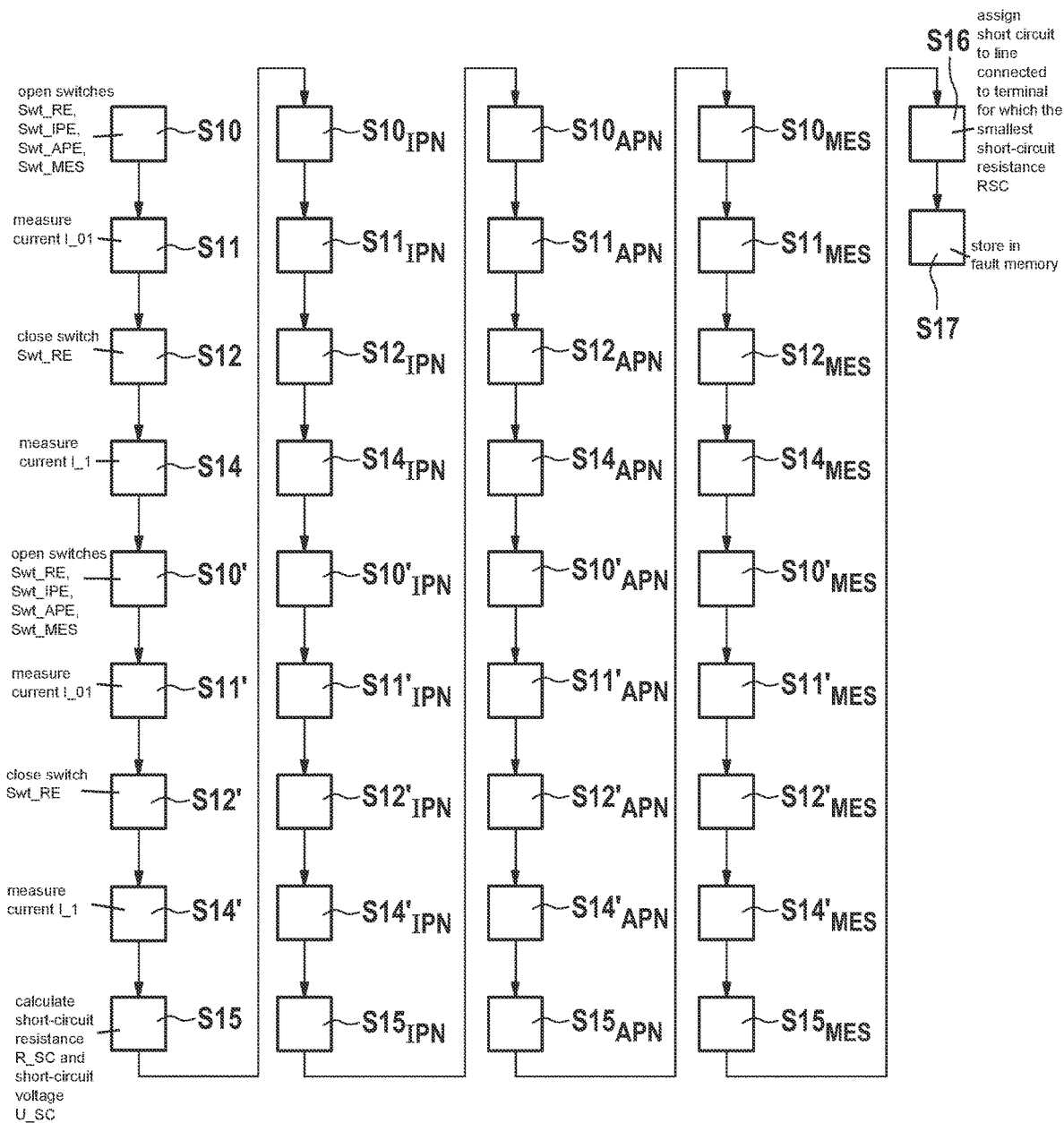
FIG. 4 shows a flow diagram of a diagnostic method with the evaluation and control unit according to FIG. 3, in accordance with an example embodiment of the present invention.

The exemplary method according to the device shown with reference to FIG. 3 is shown in FIG. 4 as a flow diagram.

For $V_{SET\ 1}$:

method step S10: opening switches $Swt_{RE}$, $Swt_{IPE}$, $Swt_{APE}$, $Swt_{MES}$ method step S11: measuring the current $I_{01}$ that flows through reference resistance $R_{Ref}$ to the defined potential method step S12: closing the switch $Swt_{RE}$ method step S14: measuring the current $I_1$ that flows through reference resistance $R_{Ref}$ to the defined potential For $V_{SET\ 2}$:

method step S10': opening switches $Swt_{RE}$, $Swt_{IPE}$, $Swt_{APE}$, $Swt_{MES}$ method step S11': measuring the current $I_{01}$ that flows through reference resistance $R_{Ref}$ to the defined potential method step S12': closing the switch $Swt_{RE}$ method step S14': measuring the current $I_1$ that flows through reference resistance $R_{Ref}$ to the defined potential method step 15: calculating the short-circuit resistance Rsc and the short-circuit voltage Usc for the at terminal RE line of the wideband lambda sensor.

Repetition of steps S10 to S14 and S10' to S14 and S15 for the other terminals IPN, APN and MES. (Method step $S10_{IPN}$ to $S14_{IPN}$ and $S10'_{IPN}$ to $S14'_{IPN}$ and $S15_{IPN}$; $S10_{APN}$ to $S14_{APN}$ and $S10'_{APN}$ to $S14'_{APN}$ and $S15_{APN}$; $S10_{MES}$ to $S14_{MES}$ and $S10'_{MES}$ to $S14'_{ME}$ and $S15_{MES}$).

Method step S16: assigning the short circuit to line 201, which is connected to the terminal RE for which the smallest short-circuit resistance RSC was determined.

Method step S17: storing the obtained information that there is a short circuit at line 201 in a fault memory of a control device connected to evaluation and control unit 100.

What is claimed is:

1. An evaluation and control unit configured to operate a wideband lambda sensor that has at least two electrical lines, comprising:
   at least two electrical terminals for electrical connection to the electrical lines of the wideband lambda sensor, each respective terminal of the electrical terminals having assigned to it a respective electrical switch via which each of the terminals is capable of being individually connected to at least one defined electrical potential;
   wherein each of the switches is voltage-resistant against a maximum short-circuit voltage that is to be expected at the respective terminal in case of fault, and
   wherein a voltage divider, which contacts each of the switches and the defined electrical potential, is provided by which, for a fault, a partial voltage of the maximum short-circuit voltage to be expected can be picked off, the partial voltage being within a measurement range of a measurement system of the evaluation and control unit.

2. The evaluation and control unit as recited in claim 1, wherein the evaluation and control unit is an ASIC.

3. The evaluation and control unit as recited in claim 2, wherein the measurement system is an ADC of the evaluation and control unit.

4. The evaluation and control unit as recited in claim 2, wherein, the voltage divider is only a single voltage divider, which contacts the defined electrical potential and the switches.

5. The evaluation and control unit as recited in claim 2, wherein the voltage divider is made up of two ohmic resistances.

6. The evaluation and control unit as recited in claim 5, wherein an ohmic resistance of the ohmic resistances, oriented toward the switches, of the voltage divider is voltage-resistant against the maximum short-circuit voltage that is to be expected at the terminals in case of fault.

7. The evaluation and control unit as recited in claim 1, wherein the defined electrical potential can assume two different defined values.

8. An evaluation and control unit configured to operate a wideband lambda sensor that has at least two electrical lines, comprising:
   at least two electrical terminals for electrical connection to the electrical lines of the wideband lambda sensor, each respective terminal of the electrical terminals having assigned to it a respective electrical switch via which each of the terminals is capable of being individually connected to at least one defined electrical potential;
   wherein each of the switches is voltage-resistant against a maximum short-circuit voltage that is to be expected at the respective terminal in case of fault, and
   wherein the terminals can be short-circuited with one another via the switches to protect the wideband lambda sensor in case of fault, and in addition a further switch is situated between the switches and the defined electrical potential, so that a flow of current through the wideband lambda sensor to the defined electrical potential can be prevented in case of fault.

9. A method for diagnosing electrical lines of a wideband lambda sensor, each respective electrical line of the electrical lines of the wideband lambda sensor being connected to a respective terminal of an evaluation and control unit, the method comprising:
   ascertaining, via the evaluation and control unit, a current assigned to the respective electrical terminal of a respective electrical switch, which is closed, or a variable representing the current, wherein the evaluation and control unit is configured to operate the wideband lambda sensor, each respective terminal of the electrical terminals having an assigned respective electrical switch via which each of the terminals is capable of being individually connected to at least one defined electrical potential, wherein each of the switches is voltage-resistant against a maximum short-circuit voltage that is to be expected at the respective terminal in case of fault; and
   (i) subsequently, assigning the short circuit, via the evaluation and control unit, to a line of the electrical lines that is connected to a terminal of the respective terminals at which the current having a highest magnitude was ascertained, and/or (ii) inferring, via the evaluation and control unit, when a magnitude of an ascertained largest current of the ascertained currents exceeds a specified or temperature-dependent threshold value, that there is a short circuit of the line of the electrical lines that is connected to the terminal of the respective terminals at which the current having the largest magnitude was ascertained.

10. The method as recited in claim 9, wherein the short circuit is assigned to a line of the electrical lines only under the further condition that the current, which is ascertained as having the largest magnitude, differs from a current of the ascertained currents, which is ascertained as having a second-largest magnitude by a specified minimum difference or by a specified minimum factor.

11. The method as recited in claim 10, wherein when it is known that there is a short circuit at one of the electrical lines, or if it is inferred that there is a short circuit and in addition it is not possible to assign the short circuit to a line because the current having the largest magnitude does not differ from the current having the second-largest magnitude by the specified minimum difference or specified minimum factor, the method is repeated after a waiting time that allows the wideband lambda sensor to cool.

12. A method for diagnosing electrical lines of a wideband lambda sensor, each respective electrical line of the electrical lines of the wideband lambda sensor being connected to a respective terminal of an evaluation and control unit, the method comprising:

ascertaining, via the evaluation and control unit, a current of each respective electrical terminal of one of the electrical switches, which is closed, or a variable representing the current, wherein the evaluation and control unit is configured to operate the wideband lambda sensor, each respective electrical terminal having a respective electrical switch via which each of the electrical terminals is individually connectable to at least one defined electrical potential, wherein each of the electrical switches is voltage-resistant against a maximum short-circuit voltage that is to be expected at the respective terminal for a fault, wherein the defined electrical potential is one of two different defined values; and (i) subsequently, assigning the short circuit, via the evaluation and control unit, to a line of the electrical lines that is connected to a terminal of the respective terminals at which the current having a highest magnitude was ascertained, and/or (ii) inferring, via the evaluation and control unit, when a magnitude of an ascertained largest current of the ascertained currents exceeds a specified or temperature-dependent threshold value, that there is a short circuit of the line of the electrical lines that is connected to the terminal of the respective terminals at which the current having the largest magnitude was ascertained;

wherein for each respective line of the electrical lines, a first current is measured while the defined potential has a first value, and a second current is measured while the defined potential has a second value different from the first value.

13. The method as recited in claim 12, wherein for each line of the electrical lines, a short-circuit resistance is determined, via the evaluation and control unit, from the first value and the second value and a value of the first current and a value of the second current, based on the assumption that the electrical lines of the lambda sensor are high-ohmic to one another.

14. The method as recited in claim 13, wherein for each line of the electrical lines, a short-circuit potential is determined, via the evaluation and control unit, from the first value and the second value and the value of the first current and the value of the second current, based on the assumption that the electrical lines of the lambda sensor are high-ohmic to one another.

15. The method as recited in claim 14, wherein a short circuit is inferred when at least one ascertained short-circuit resistance of the short-circuit resistances is below a specified threshold value and the short circuit is assigned to a line of the electrical lines that is connected to the respective terminal at which a smallest short-circuit resistance occurred.

16. The method as recited in claim 15, wherein information about presence of a short circuit, including about a fact of a short circuit, about a line at which the short circuit was determined, about the short circuit potential, and/or about the short-circuit resistance are stored.

17. The method as recited in claim 16, wherein the information is stored an entry in the evaluation and control unit and/or in a control device connected to the evaluation and control unit.

* * * * *